US006891461B2

(12) United States Patent
Gardner

(10) Patent No.: US 6,891,461 B2
(45) Date of Patent: May 10, 2005

(54) INTEGRATED TRANSFORMER

(75) Inventor: Donald S. Gardner, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 100 days.

(21) Appl. No.: 09/813,496

(22) Filed: Mar. 21, 2001

(65) Prior Publication Data

US 2001/0050607 A1 Dec. 13, 2001

Related U.S. Application Data

(63) Continuation-in-part of application No. 09/766,162, filed on Jan. 19, 2001, which is a continuation-in-part of application No. 09/444,608, filed on Nov. 23, 1999.

(51) Int. Cl.$^7$ .............................................. H01F 5/00
(52) U.S. Cl. ..................... 336/200; 336/83; 257/531
(58) Field of Search .................. 336/83, 200, 206–208, 336/220–222, 232, 233; 257/531

(56) References Cited

U.S. PATENT DOCUMENTS

| 3,607,462 A | 9/1971 | Laing |
| 3,881,244 A | 5/1975 | Kendall |
| 3,905,883 A | 9/1975 | Hanazono et al. |
| 4,543,553 A | 9/1985 | Mandai et al. |
| 4,791,719 A | 12/1988 | Kobayashi et al. |
| 4,797,648 A | 1/1989 | Kaneko et al. |
| 4,816,784 A | 3/1989 | Rabjohn |
| 5,047,296 A | 9/1991 | Miltenberger et al. |
| 5,095,357 A | 3/1992 | Andoh et al. |
| 5,121,852 A | 6/1992 | Wilkes |
| 5,221,459 A | 6/1993 | Okano et al. |
| 5,420,558 A | 5/1995 | Ito et al. |
| 5,446,311 A | 8/1995 | Ewen et al. |
| 5,469,399 A | 11/1995 | Sato et al. |

(Continued)

FOREIGN PATENT DOCUMENTS

| DE | 41 17 878 A1 | 12/1981 |
| EP | 0 295 028 | 12/1988 |
| EP | 0 725 407 A1 | 8/1996 |
| EP | 0 884 783 A2 | 12/1998 |
| JP | 61 020311 A | 1/1986 |
| JP | 06124843 A | 5/1994 |
| JP | 07-272932 | 10/1995 |
| WO | WO 01/39220 A1 | 5/2001 |

OTHER PUBLICATIONS

K. Shirakawa, et al., "Thin Film Cloth–Structured Inductor For Magnetic Integrated Circuit," IEEE Transactions on Magnetics, Sep. 1990, pp. 2262–2264, vol. 26, No. 5.

(Continued)

Primary Examiner—Tuyen T. Nguyen
(74) Attorney, Agent, or Firm—Blakely, Sokoloff, Taylor & Zafman LLP

(57) ABSTRACT

A transformer comprises a first inductor and a second inductor. The first inductor has one or more trenches and comprises a first conductor defining a signal path along the one or more trenches of the first inductor. The second inductor has one or more trenches and comprises a second conductor defining a signal path along the one or more trenches of the second inductor.

14 Claims, 8 Drawing Sheets

U.S. PATENT DOCUMENTS

| | | | |
|---|---|---|---|
| 5,530,415 | A | 6/1996 | Takaya et al. |
| 5,583,474 | A | 12/1996 | Mizoguchi et al. |
| 5,609,946 | A | 3/1997 | Korman et al. |
| 5,635,892 | A | 6/1997 | Ashby et al. |
| 5,694,030 | A | 12/1997 | Sato et al. |
| 5,705,287 | A | 1/1998 | Doerner et al. |
| 5,753,391 | A | 5/1998 | Stone et al. |
| 5,801,100 | A | 9/1998 | Lee et al. |
| 5,834,825 | A | 11/1998 | Imai |
| 5,877,533 | A | 3/1999 | Arai et al. |
| 5,892,425 | A | 4/1999 | Kuhn et al. |
| 5,952,704 | A | 9/1999 | Yu et al. |
| 5,961,746 | A | 10/1999 | Nepela |
| 5,976,715 | A | 11/1999 | Chen et al. |
| 6,031,445 | A * | 2/2000 | Marty et al. ............... 336/200 |
| 6,033,782 | A | 3/2000 | Hubbard et al. |
| 6,037,649 | A | 3/2000 | Liou |
| 6,040,226 | A | 3/2000 | Wojnarowski et al. |
| 6,067,002 | A * | 5/2000 | Fujino et al. ............... 336/200 |
| 6,103,136 | A | 8/2000 | Han et al. |
| 6,114,937 | A | 9/2000 | Burghartz et al. |
| 6,121,852 | A | 9/2000 | Mizoguchi et al. |
| 6,166,422 | A | 12/2000 | Qian et al. |
| 6,191,495 | B1 | 2/2001 | Kossives et al. |
| 6,201,287 | B1 | 3/2001 | Forbes |
| 6,207,303 | B1 | 3/2001 | Tomita |
| 6,240,621 | B1 | 6/2001 | Nellissen et al. |
| 6,281,560 | B1 | 8/2001 | Allen et al. |
| 6,291,305 | B1 | 9/2001 | Huang et al. |
| 6,344,125 | B1 | 2/2002 | Locke et al. |
| 6,404,317 | B1 | 6/2002 | Mizoguchi et al. |
| 6,441,715 | B1 * | 8/2002 | Johnson ...................... 336/200 |

OTHER PUBLICATIONS

M. Yamaguchi, et al., "Characteristics Of Magnetic Thin–Film Inductors At Large Magnetic Field," IEEE Transactions on Magnetics, Nov. 1995, pp. 4229–4231, vol. 31, No. 6.

E. Brandon, et al., "Microinductors For Spacecraft Power Electronics," Magnetic Materials, Processes, and Devices VI Applications to Storage and Microelectromechanical Systems (MEMS), 2001, pp. 559–567, vol. 2000–29, The Electrochemical Society, Inc., Pennington, New Jeresy, no date.

Erik J. Brandon, "Passive Components For Systems–On–A–Chip Applications," Center for Integrated Space Microsystems, Jet Propulsion Laboratory, no date.

S.S. Mohan, et al., "Simple Accurate Expressions For Planar Spiral Inductances," IEEE Journal of Solid–State Circuits, Oct. 1999, pp. 1419–1424, vol. 34, No. 10.

Joachim N. Burghartz, "Integrated Multilayer RF Passives in Silicon Technology," IBM Research Division, Yorktown Heights, NY, no date.

Jae Yeong Park, et al., "Batch–Fabricated Microinductors With Electroplated Magnetically Anisotropic and Laminated Alloy Cores," IEEE Transactions on Magnetics, Sep. 1999, pp. 4291–4300, vol. 35, No. 5.

M. Yamaguchi, et al., "MGHz–Drive Magnetic Thin–Film Inductors For RF Integrated Circuits Using Micro–Patterned Granular Film" IEEE, 1990, no month.

Ali M. Niknejad and Robert G. Meyer, "Analysis, Design, and Optimization of Spiral Inductors and Transformers for Si RF IC's," IEEE Journal of Solid–State Circuits, Oct. 1998, pp. 1470–1481, vol. 33. No. 10.

Donald S. Gardner and Paul A. Flinn, "Mechanical Stress As A Function Of Temperature For Aluminum Alloy Films," Journal of Applied Physics, Feb. 15, 1990, pp. 1831–1845, vol. 67.

M. Baba, et al., "GHz–Drive Magnetic Thin–Film Inductor Using CoNbZr Film," Journal of the Magnetics Society of Japan 2000, no month.

Y. Kobayashi, et al., "New Type Micro Cloth–Inductor And Transformer With Thin Amorphous Wires And Multi–Thin Coils," IEEE Transactions on Magnetics, Sep. 1992, pp. 3012–3014, vol. 28, No. 5.

H. Matsuki and K. Murakami, "A New Cloth Inductor Using Amorphous Fiber," IEEE Transactions on Magnetics, Sep. 1985, pp. 1738–1740, vol. MAG–21, No. 5.

V. Korenivski and R.B. Van Dover, "Magnetic Film Inductors For Radio Frequency Applications," Journal of Applied Physics, Nov. 15, 1997, pp. 5247–5254, vol. 82.

M. Yamaguchi, et al., "Microfabrication And Characteristics Of Magnetics Thin–Film Inductors In The Ultrahigh Frequency Region," Journal of Applied Physics, Jun. 1, 1999, pp. 7919–7922, vol. 85, No. 11.

John R. Long and Miles A. Copeland, "The Modeling, Characterization, And Design Of Monolithic Inductors For Silicon RF IC's," IEEE Journal of Solid–State Circuits, Mar. 1997, pp. 357–369, vol. 32, No. 3.

M. Yamaguchi, et al., "Magnetic Thin–Film Inductor For RF Integrated Circuits," Extended Abstracts of the 1999 International Conference on Solid–State Devices and Materials, 1999, pp. 580–281, Tokyo.

T. Sato, et al., "New Applications of Nanocrystalline Fe(Co–Fe)–Hf–O Magnetic Films To Micromagnetic Devices," Journal of Applied Physics, Jun. 1, 1998, pp. 6658–6660, vol. 83, No. 11.

A. Fessant, et al., "Influence Of In–Plane Anisotropy And Eddy Currents On The Frequency Spectra Of The Complex Permeability Of Amorphous CoZr Films," IEEE Transactions of Magnetics, Jan. 1993, pp. 82–87, vol. 29, No. 1.

Joachim N. Burghartz, "Progress In RF Inductors On Silicon—Understanding Substrate Losses," IBM Research Division, Yorktown Heights, NY, no date.

S. Yabukami, et al., "Noise Analysis Of A MHz–3 GHz Magnetic Thin Film Permeance Meter," Journal of Applied Physics, Apr. 15, 1999, pp. 5148–5150, vol. 85. No. 8.

Jae Park and Mark G. Allen, "Bar–Type Microinductors and Microtransformers With Electroplated Alloy Cores," Magnetic Devices Research, sponsored by Packaging Research Center, no date.

Erick Brandon, "System On A Chip Integrated Passive Components ($\mu$IRS)", no date.

Masahiro Yamaguchi, "Magnetic Films For Planar Inductive Components And Devices," Handbook of Thin Film Devices, edited by M.H. Francombe, 2000, pp. 185–186, vol. 4: Magnetic Thin Film Devices, no month.

S.S. Mohan, et al., "Bandwidth Extension In CMOS With Optimized On–Chip Inductors,"IEEE Journal of Solid–State Circuits, Mar. 2000, pp. 346–355, vol. 35, No. 3.

S.S. Mohan, et al., "Modeling And Characterization Of On–Chip Transformers," Center for Integrated Systems, Stanford University, Stanford, CA 94305, no date.

M.M. Mojarradi, et al., "Power Management And Distribution For System On A Chip For Space Applications," Jet Propulsion Laboratory, California Institute of Technology, under a contract with the National Aeronautics and Space Administration, Paper No. 284, no date.

Terence O'Donnel et al., "Microtransformers and Inductors Using Permalloy Thin Films," Preparation, Properties, and Applications of Thin Ferromagnetic Films, Jun. 2000, pp. 45–52.

C. Patrick Yue and S. Simon Wong, "On–Chip Spiral Inductors With Patterned Ground Shields For Si–Based RF IC's," IEEE Journal of Solid–State Circuits, May 1998, pp. 743–752, Vol. 33, No. 5.

Donald S. Gardner, U. S. Patent Application for "Method and Apparatus for Providing Inductor for Integrated Circuit or Integrated Circuit Package", no date.

Gardner, Donald, et al., High Frequency (GHz) and Low Resistance Integrated Inductors Using Magnetic Materials, Intel Corporation, Components Research, Santa Clara, CA., Dept. of Materials Science and Engr., Stanford University, Stanford, CA, ©2001 IEEE, 3 pages, no date.

Tomita, Hiroshi, et al., Oblique–Field Annealing Effect for In–plane Magnetic Anisotropy of Soft Magnetic Co–Nb–Zr Thin Films, IEEE Transactions On Magnetics, May 1994, pp. 1336–1339, vol. 30, No. 3, no date.

Search Report for PCT/US 02/00848, mailed Oct. 15, 2002, 4 pages.

Search Report for PCT/US 02/01555, mailed Oct. 15, 2002, 5 pages.

Search Report for PCT/US 02/01742, mailed Oct. 18, 2002, 5 pages.

ROC (Taiwan) Patent Publication No. 378417 published Jan. 1, 2000.

ROC (Taiwan) Patent Publication No. 411481 published Nov. 11, 2000.

ROC (Taiwan) Patent Publication No. 386310, published Apr. 1, 2000.

* cited by examiner

INTEGRATED TRANSFORMER

This patent application is a continuation-in-part patent application of U.S. patent application Ser. No. 09/766,162, filed Jan. 19, 2001, entitled INTEGRATED INDUCTOR, by Donald S. Gardner, which is a continuation-in-part patent application of U.S. patent application Ser. No. 09/444,608, filed Nov. 23, 1999, entitled METHOD AND APPARATUS FOR PROVIDING INDUCTOR FOR INTEGRATED CIRCUIT OR INTEGRATED CIRCUIT PACKAGE, by Donald S. Gardner.

BACKGROUND OF THE INVENTION

1. Field of the Invention

The present invention relates generally to the field of electrical transformers. More particularly, the present invention relates to the field of electrical transformers for integrated circuits (ICs) and IC packages.

2. Description of Related Art

Electrical transformers are typically used in a variety of microelectronic circuit applications such as, for example, power converters, power delivery devices, power isolation devices, and radio frequency (RF) and microwave circuitry including matching networks, oscillators, amplifiers, and filters. Because discrete transformers result in losses, for example, due to parasitic capacitance and resistance in connecting them to an integrated circuit and because discrete transformers incur a relatively high cost for assembly, transformers are preferably fabricated on-chip, that is either integrated on an integrated circuit and/or in a package housing an integrated circuit.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The following detailed description sets forth an embodiment or embodiments in accordance with the present invention for an integrated transformer. In the following description, details are set forth such as specific materials, parameters, etc. in order to provide a thorough understanding of the present invention. It will be evident, however, that the present invention may be practiced without these details. In other instances, well-known process steps, equipment, etc. have not been described in particular detail so as not to obscure the present invention.

Integrated Transformer Structure

Figure 1:
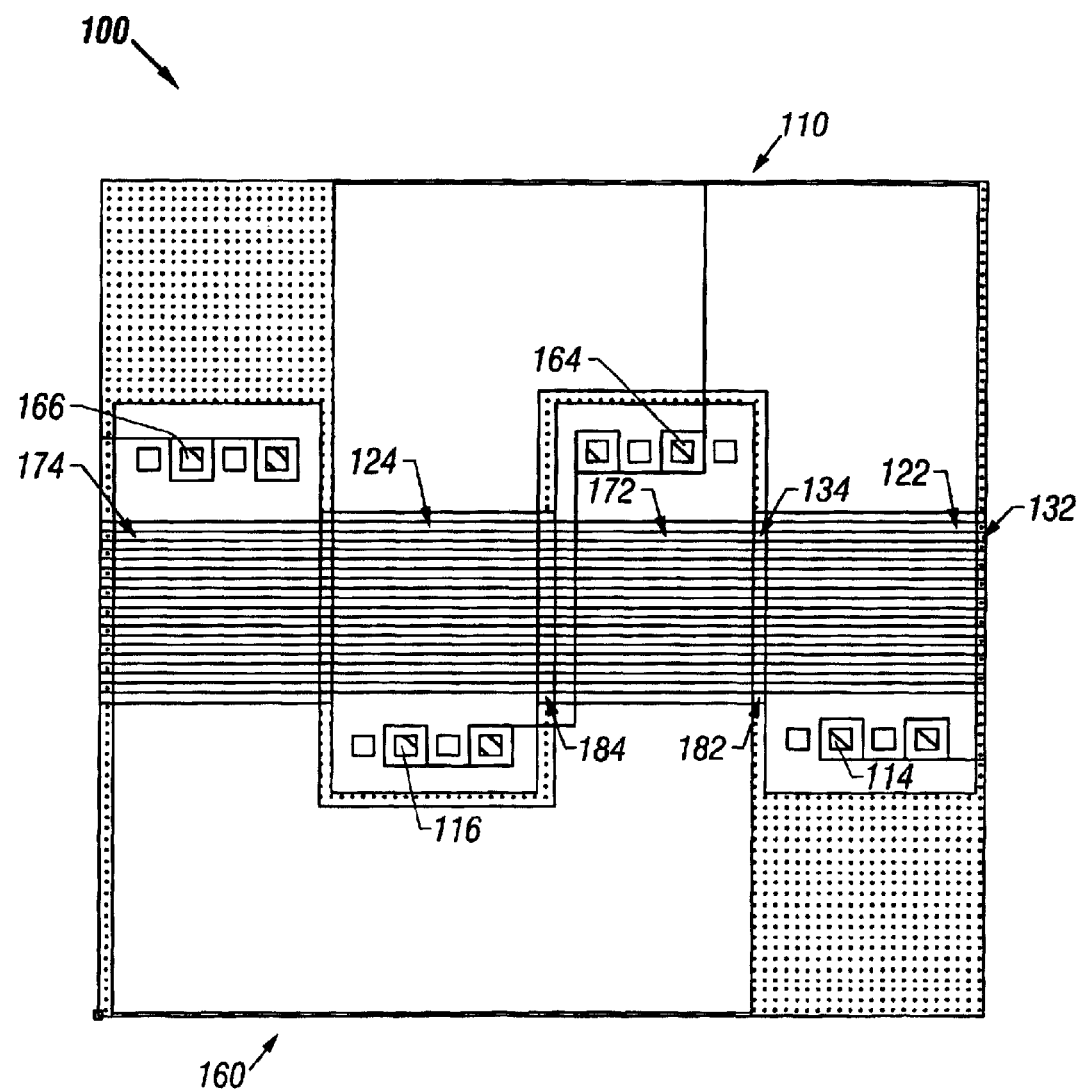
FIG. 1 illustrates, for one embodiment, a plan view of an integrated transformer.

FIG. 1 illustrates, for one embodiment, an integrated transformer 100. Integrated transformer 100 comprises integrated inductors 110 and 160. Inductor 110 corresponds to a primary coil of a conventional transformer, and inductor 160 corresponds to a secondary coil. As inductors 110 and 160 are electrically isolated from one another, transformer 100 for one embodiment may be used to couple signals or power from one circuit to another while isolating direct current (dc) biases. Transformer 100 may also be used to help reduce noise.

Inductor 110 has one or more trenches, such as trenches 122 and 124 for example, and comprises a conductor defining a signal path through the one or more trenches. Current may flow through the conductor along the signal path by applying a voltage potential across a node 114 near one end of the conductor and another node 116 near another end of the conductor. Inductor 110 generates an electromagnetic field as current flows along the signal path of the conductor and generates a magnetic flux along the length of each trench, that is across the width of the signal path defined by the conductor.

Inductor 160 has one or more trenches, such as trenches 172 and 174 for example, and comprises a conductor defining a signal path through the one or more trenches. Inductor 160 is positioned relative to inductor 110 such that the electromagnetic field generated by inductor 110 induces a voltage potential across a node 164 near one end of the conductor and another node 166 near another end of the conductor. Current then flows through the conductor of inductor 160. Inductor 160 for one embodiment is positioned relative to inductor 110 such that any magnetic flux generated by inductor 110 generally flows along the length of each trench of inductor 160, that is across the width of the signal path defined by the conductor. The induced voltage potential across inductor 160 may be stepped up or stepped down from the voltage potential applied across inductor 110 as desired in designing inductor 110 and 160.

Inductors 110 and 160 for one embodiment are each generally U-shaped as illustrated in FIG. 1. Each leg of inductor 110 has one or more trenches, and each leg of inductor 160 has one or more trenches. Inductor 110 and inductor 160 for one embodiment, as illustrated in FIG. 1, are positioned with respect to one another such that at least a portion of one leg of inductor 110 is positioned between each leg of inductor 160 and such that at least a portion of one leg of inductor 160 is positioned between each leg of inductor 110. In this manner, the magnetic flux generated across each leg of inductor 110 is linked to one another and flows across both legs of inductor 160.

Each leg of inductor 110 and 160 may define one or more trenches in any suitable manner such that each leg of inductors 110 and 160 may be positioned to align each trench of each leg relative to one another with any suitable spacing between adjacent legs to induce any desirable voltage potential across inductor 160 for a given voltage potential applied across inductor 110. The one or more trenches of each leg of inductor 110 and 160 may be aligned with the one or more trenches of any other leg of inductor 110 or 160 in any suitable manner.

As current may flow in opposite directions along each leg of inductor 110, the one or more trenches of one leg of inductor 110, for one embodiment, are physically displaced by approximately 180° from the one or more trenches of the other leg of inductor 110 to help align the magnetic flux across each leg of inductor 110 and therefore help increase the resulting inductance of inductor 110. The one or more trenches of one leg of inductor 160 may be similarly displaced relative to the one or more trenches of the other leg of inductor 160. For other embodiments, displacement of trenches between adjacent legs of inductor 110 and/or inductor 160 may differ from 180°. The physical alignment of one or more trenches of inductor 160 relative to one or more trenches of inductor 110, such as by approximately 0° or by approximately 180° for example, helps determine the polarity of induced voltage potential across inductor 160.

Each leg of inductors 110 and 160 may define any suitable number of one or more trenches of any suitable shape, dimensions, and spacing between trenches. Each trench for one embodiment may be shaped with a generally rectangular cross-sectional profile across the width of the trench. For other embodiments, one or more trenches of each leg may be shaped with a generally stepped cross-sectional profile or a generally U-shaped or V-shaped cross-sectional profile. The number of trenches, the shape and dimensions of each trench, and the spacing between trenches on each leg of inductors 110 and 160 may help determine the amount of the voltage potential induced across inductor 160 for a given voltage potential applied across inductor 110. The material and dimensions of the conductor for each inductor 110 and 160 may also help determine the amount of the voltage potential induced across inductor 160 based on a given voltage potential applied across inductor 110.

Figure 2:
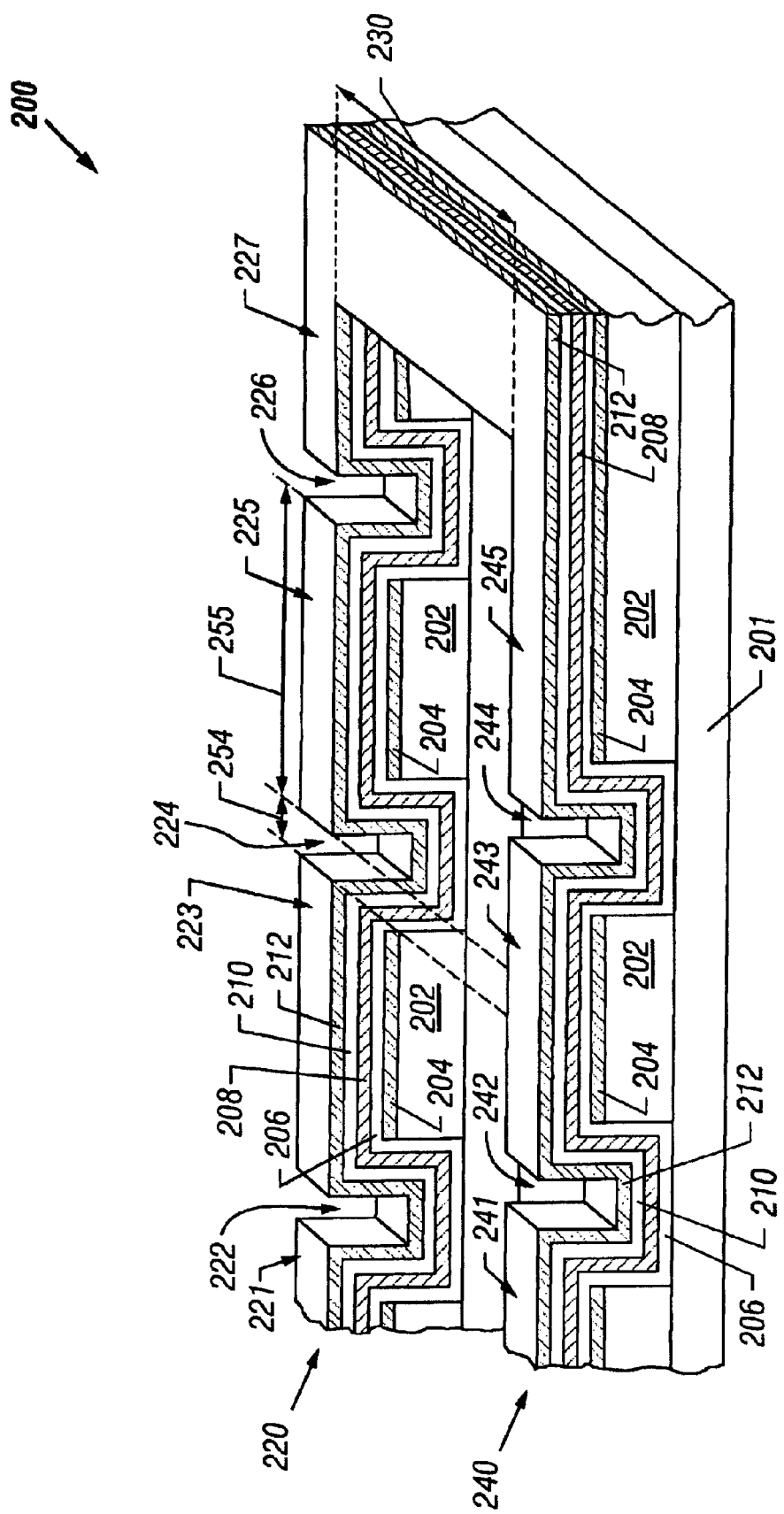
FIG. 2 illustrates, for one embodiment, a perspective view of an integrated inductor forming a portion of the integrated transformer of FIG. 1.

Inductor 110 for one embodiment is illustrated in FIG. 2. Inductor 160 for one embodiment is similarly fabricated as inductor 110. Inductors 110 and 160 may each be designed to have any suitable frequency range and any desirable quality factor Q α ωL/R, where ω is the operating frequency for the inductor, L is the inductance of the inductor, and R is the resistance of the inductor.

As the quality factor Q of inductor 110 and 160 is proportional to the inductance L of the inductor and inversely proportional to the resistance R of the inductor, inductor 110 or 160 can be fabricated with a relatively higher inductance L, and therefore a relatively higher quality factor Q, for a given area or resistance R of the inductor. Alternatively, for a given inductance L, inductor 110 or 160 can be fabricated with a relatively smaller area and therefore a relatively lower resistance R and capacitance, resulting in a relatively higher resonance frequency $\omega_r$ and a relatively higher quality factor Q.

Inductors 110 and 160 for one embodiment are each fabricated to have an increased self-inductance to help increase the quality factor Q of each inductor 110 and 160 and to help form transformer 100 with a relatively high mutual inductance between inductors 110 and 160. Inductors 110 and 160 for one embodiment are each designed to have a lower resistance to help increase the quality factor Q of each inductor 110 and 160.

As illustrated in FIG. 2, inductor 110 comprises a substrate 201, a first dielectric layer 202, a first magnetic layer 204, a second dielectric layer 206, a conductive layer 208, a third dielectric layer 210, and a second magnetic layer 212. Dielectric layer 202 helps insulate magnetic layer 204 from substrate 201. Dielectric layer 206 helps insulate conductive layer 208 from magnetic layer 204. Dielectric layer 210 helps insulate magnetic layer 212 from conductive layer 208.

Conductive layer 208 defines a signal path along a leg 220 of alternating pedestals 221, 223, 225, and 227 and trenches 222, 224, and 226, across an interconnect portion 230, and along another leg 240 of alternating pedestals 241, 243, and 245 and trenches 242 and 244. Conductive layer 208 may comprise any suitable conductive material and may have any suitable dimensions. Conductive layer 208 may have any suitable width, thickness, and length to form a generally U-shaped signal path covering an area of any suitable size.

Inductor 110 for one embodiment may be fabricated to define a relatively wide signal path to help minimize the resistance of inductor 110. For one embodiment, inductor 110 may define a signal path with a width up to and including approximately 1 millimeter (mm). For another embodiment, inductor 110 may define a signal path with a width up to and including approximately 1 centimeter (cm). Inductor 110 for one embodiment may also be fabricated with a signal path having a relatively shorter length, including the length of interconnect portion 230, to help minimize the resistance of inductor 110. The pedestals and trenches in leg 220 for one embodiment are displaced by approximately 180° from the pedestals and trenches in leg 240 to help align the magnetic flux across each leg 220 and 240 and therefore help increase the resulting inductance of inductor 110.

Conductive layer 208 comprises a lower segment for each trench, such as lower segment 254 for trench 224 for example, and an upper segment for each pedestal, such as upper segment 255 for pedestal 225 for example. Each upper and lower segment may have any suitable length. For one embodiment, each upper segment of one or more legs of inductor 110 may be relatively longer than each lower segment of the same leg. For other embodiments, each upper segment of one or more legs of inductor 110 may be relatively shorter than or approximately equal in length to each lower segment of the same leg. The length of one of more legs of inductor 110 may be greater than, approximately equal to, or less than the width of the same leg. The length of one or more legs of inductor 110 for one embodiment is substantially greater than the width of the same leg.

Magnetic layer 204 lies beneath conductive layer 208, and magnetic layer 212 lies over conductive layer 208. Magnetic layer 204 may lie beneath conductive layer 208 at each pedestal, as illustrated in FIG. 2, and/or beneath conductive layer 208 along the sidewalls and/or bottom of each trench. Magnetic layer 212 may lie over conductive layer 208 in each trench and/or over conductive layer 208 at each pedestal.

Magnetic layers 204 and 212 each form a voltage reference plane for inductor 110 to help contain electric and magnetic fields around conductive layer 208. Magnetic layers 204 and 212 therefore each help increase the inductance L of inductor 110, and therefore the quality factor Q for inductor 110. Magnetic layers 204 and 212 are each optional. Although using only one magnetic layer 204 or 212 helps increase the inductance L of inductor 110, using both magnetic layers 204 and 212 helps further increase the inductance L of inductor 110.

Inductor 110 generates magnetic flux generally parallel to substrate 201, helping to reduce concern for induced Eddy or mirror currents and therefore losses in inductor 110 and noise in substrate 201. Positioning magnetic layer 120 between substrate 201 and conductive layer 208 helps further reduce any concern for inducing such currents in substrate 201 and minimizes concern for interference between inductor 110 and neighboring circuitry. Magnetic layer 204 also helps prevent substrate coupling and helps reduce substrate dependency.

Magnetic layers 204 and 212 may each comprise any suitable magnetic material and have any suitable dimensions. Magnetic layer 212 may or may not comprise the same magnetic material as magnetic layer 204.

Magnetic layers 204 and 212 for one embodiment each have a relatively high magnetic permeability, a relatively high saturation magnetization, and a relatively high magnetic resonance frequency to allow inductor 110 to operate at relatively high frequencies, such as in the GigaHertz (GHz) range for example. Permeability is a measure of the ability of a magnetic material to magnetize. A non-magnetic material has a relative permeability of one. A magnetic material having a relatively high saturation magnetization allows for relatively high currents to be used. The increase in inductance L due to magnetic layer 204 helps increase the quality factor Q for inductor 110.

Magnetic layers 204 and 212 for one embodiment are each compatible with available semiconductor processing and packaging technology that may be used to form a chip having inductor 110. That is, magnetic layers 204 and 212 may each be formed and optionally patterned using available semiconductor processing technology and may generally withstand relatively high temperatures encountered in processing and packaging a chip on which inductor 110 is formed without crystallizing or significantly changing the relevant properties of magnetic layers 204 and 212.

Magnetic layers 204 and 212 for one embodiment are coupled to one another and to corresponding magnetic layers of inductor 160. In this manner, transformer 100 comprises magnetic strips that extend across each leg of inductors 110 and 160, helping to increase the self-inductance of each inductor 110 and 160 and the mutual inductance between inductor 110 and 160.

For one embodiment where the one or more trenches of adjacent legs of transformer 100 are displaced by approximately 180°, for example, relative to one another, magnetic layer 204 of one leg of inductor 110 may be coupled to magnetic layer 212 through a suitable via, for example, at or near one or both ends of each pedestal of that leg, such as at or near pedestal ends 132 and 134 of FIG. 1 for example. Also, the lower magnetic layer of the adjacent leg of inductor 160 may be coupled to the upper magnetic layer of inductor 160 through a suitable via, for example, at or near one or both ends of each pedestal of that leg, such as at or near pedestal ends 182 and 184 of FIG. 1 for example. Magnetic layer 212 and the upper magnetic layer of inductor 160 may be coupled to one another to help form magnetic strips across the adjacent legs of transformer 100.

For one embodiment where the one or more trenches of adjacent legs of transformer 100 have a physical alignment of approximately 0°, for example, relative to one another, magnetic layer 204 of one leg of inductor 110 may be coupled to the lower magnetic layer of the adjacent leg of inductor 160 and magnetic layer 212 of the one leg of inductor 110 may be coupled to the upper magnetic layer of the adjacent leg of inductor 160 to help form magnetic strips across the adjacent legs of transformer 100.

Although each inductor 110 and 160 is illustrated as defining two legs, other suitable primary and secondary inductors having any suitable number of one or more legs of any suitable number of one or more trenches may be similarly fabricated as inductor 110 and 160 and positioned relative to one another in any suitable manner to form an integrated transformer. The primary inductor and/or the secondary inductor may be fabricated such that a magnetic strip extends across any adjacent legs of the integrated transformer. The number of legs of each inductor for an integrated transformer helps determine the amount of the voltage potential induced across the secondary inductor for a given voltage potential applied across the primary inductor.

Figure 3:
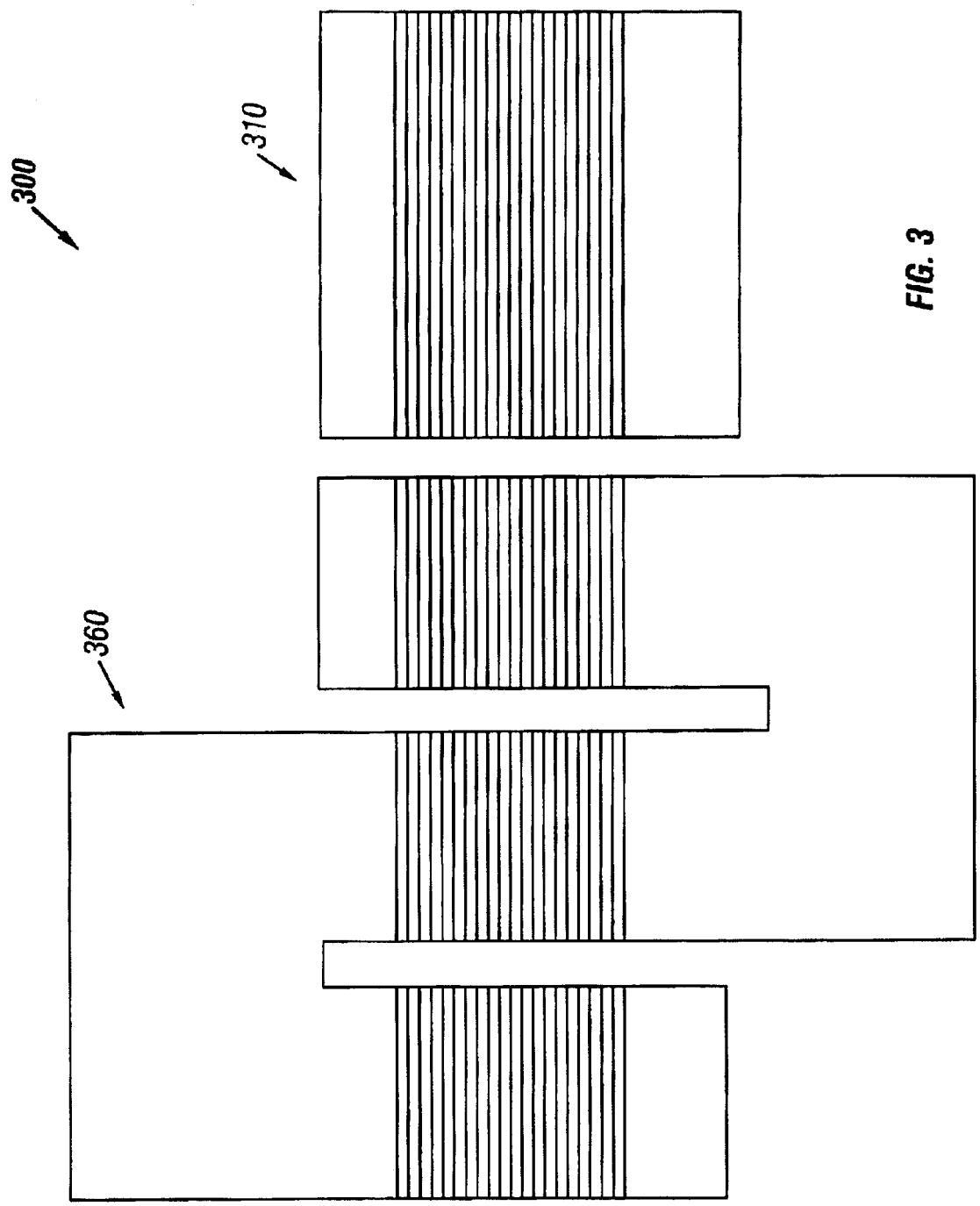
FIG. 3 illustrates, for one embodiment, a plan view of another integrated transformer.

FIG. 3 illustrates, for one embodiment, an integrated transformer 300. Integrated transformer 300 comprises integrated inductors 310 and 360. Inductor 310 has only one leg of one or more trenches, and inductor 360 has three legs of one or more trenches. Inductors 310 and 360 may each be similarly fabricated as inductors 110 and 160, respectively. Inductor 310 generates an electromagnetic field when a voltage potential is applied across inductor 310. Inductor 360 is positioned relative to inductor 310 such that the electromagnetic field generated by inductor 310 induces a voltage potential across inductor 360. For one embodiment, as illustrated in FIG. 3, inductors 310 and 360 are positioned in a side-by-side relationship. For another embodiment, inductor 310 may be positioned between any two adjacent legs of inductor 360.

For other embodiments, a one leg inductor may be positioned in a side-by-side relationship with another one leg inductor. A one leg inductor may be positioned in a side-by-side relationship with a two leg inductor. A one leg inductor may be positioned between each leg of a two leg inductor. A two leg inductor may be positioned in a side-by-side relationship with a two leg inductor. A two leg inductor may be positioned relative to a three leg inductor such that any one leg of the three leg inductor is between each leg of the two leg inductor. The middle leg of a three leg inductor may be positioned between each leg of a two leg inductor, for example, by connecting each leg of the two leg inductor at a lower or higher level relative to the three leg inductor. A three leg inductor may be positioned in a side-by-side relationship with a three leg inductor. A three leg inductor may be positioned relative to a three leg inductor such that one or two legs of one three leg inductor are between two legs of the other three leg inductor.

Although each inductor 110, 160, 310, and 360 is illustrated as defining one signal path, other suitable primary and secondary inductors each having any suitable number of one or more signal paths each along any suitable number of one or more legs of any suitable number of one or more trenches may be similarly fabricated as inductor 110 and 160 and positioned relative to one another in any suitable manner to form an integrated transformer. The primary inductor and/or the secondary inductor may be fabricated such that a magnetic strip extends across any adjacent legs of the integrated transformer.

Figure 4:
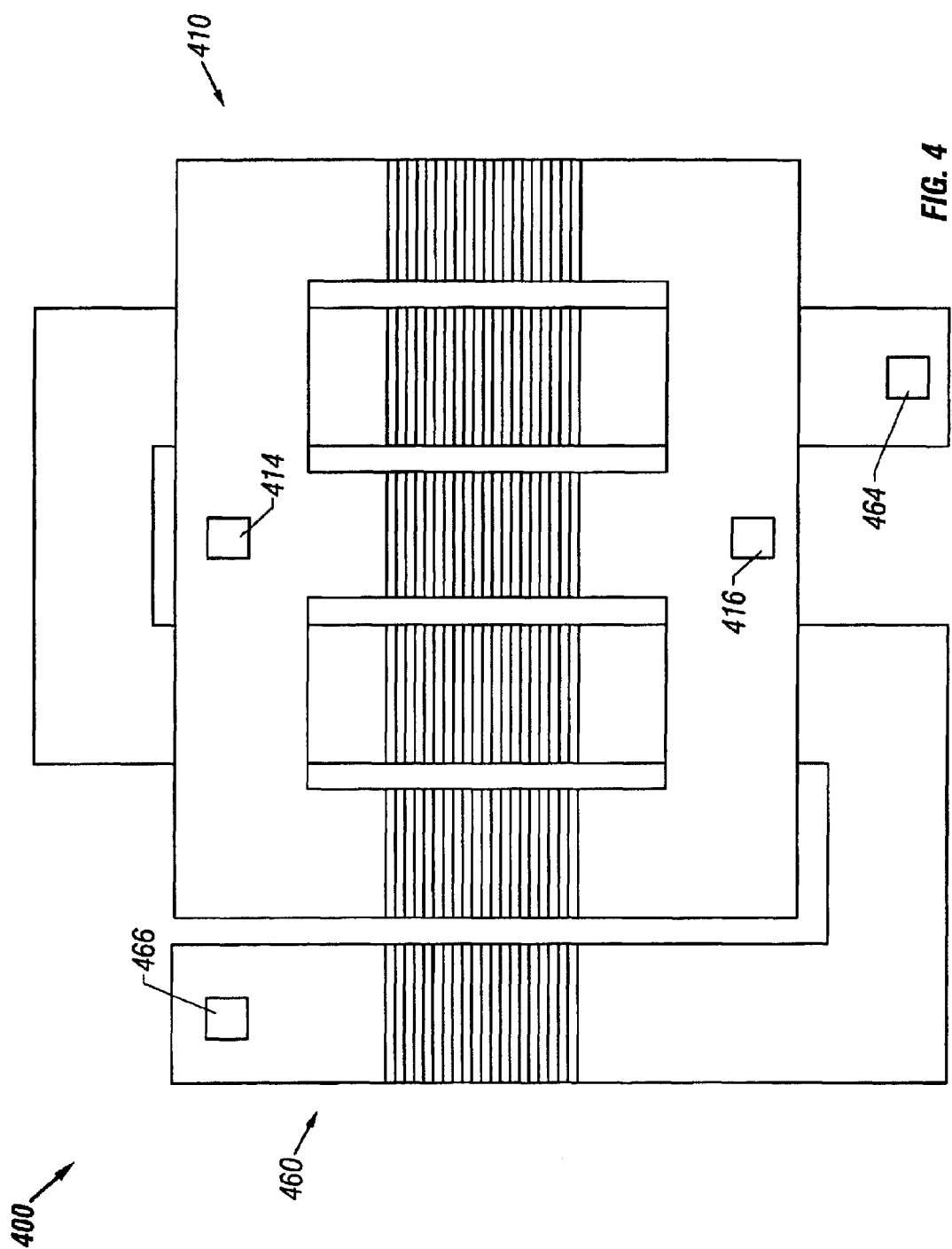
FIG. 4 illustrates, for one embodiment, a plan view of another integrated transformer.

FIG. 4 illustrates, for one embodiment, an integrated transformer 400. Integrated transformer 400 comprises integrated inductors 410 and 460. Inductor 410 defines three signal paths each along a separate leg of one or more trenches, and inductor 460 defines one signal path along three legs of one or more trenches. Inductors 410 and 460 may each be similarly fabricated as inductors 110 and 160, respectively. Inductor 410 generates an electromagnetic field when a voltage potential is applied across nodes 414 and 416 of inductor 410. Inductor 460 is positioned relative to inductor 410 such that the electromagnetic field generated by inductor 410 induces a voltage potential across nodes 464 and 466 of inductor 460.

As illustrated in FIG. 4, at least a portion of each of two legs of inductor 460 are positioned between two legs of inductor 410. Where a leg of inductor 460 intersects an interconnect portion of inductor 410, the intersecting portions of the leg of inductor 460 and of the interconnect portion of inductor 410 are formed at different levels.

Although each transformer 100, 300, and 400 is illustrated as comprising one primary inductor and one secondary inductor, any suitable number of primary and secondary inductors each having any suitable number of one or more signal paths each along any suitable number of one or more legs of any suitable number of one or more trenches may be positioned relative to one another in any suitable manner to form an integrated transformer. As one example, two secondary inductors may be positioned relative to one primary inductor in any suitable manner to form an integrated transformer.

Integrated Transformer Fabrication

Figure 5:
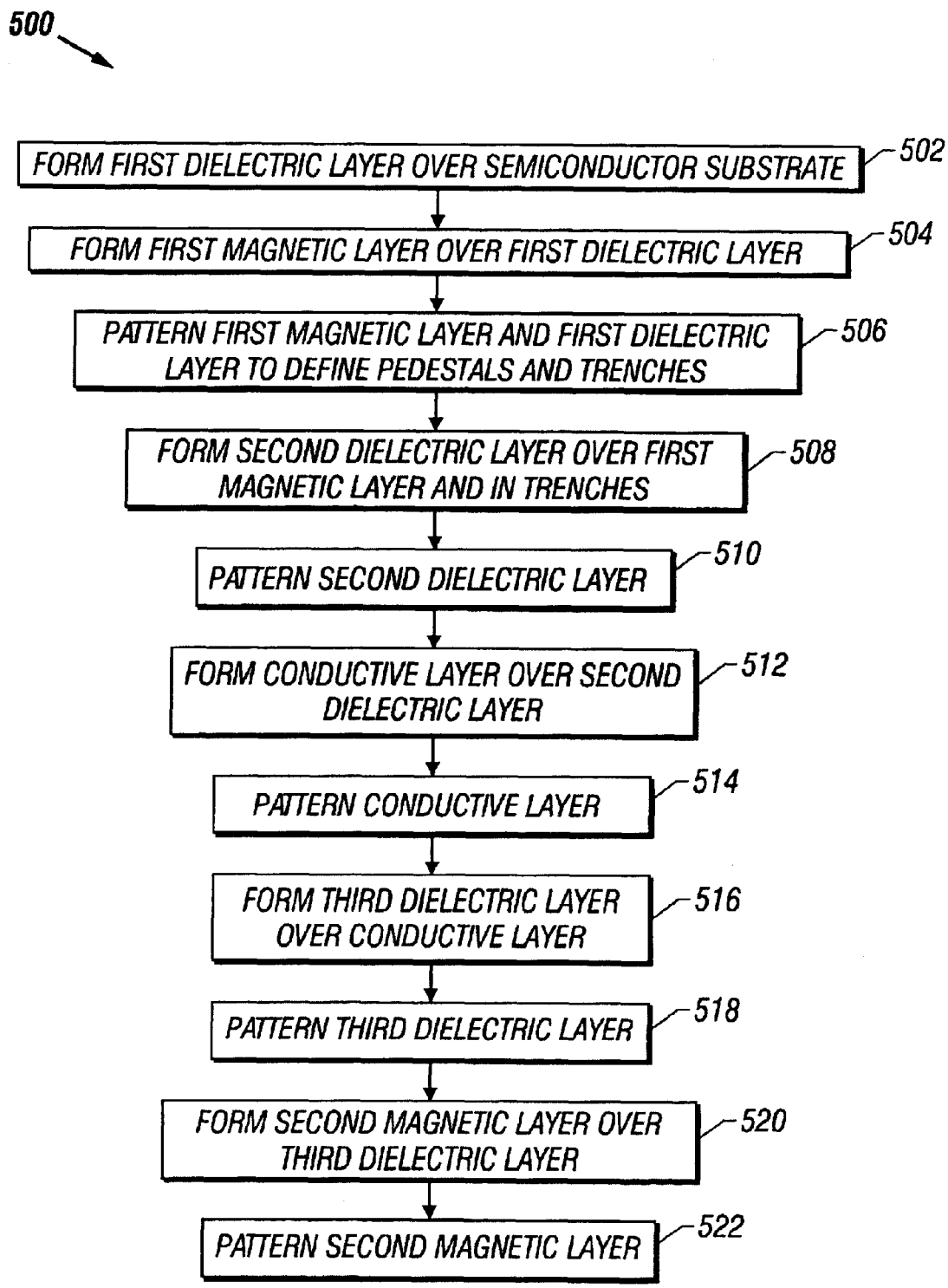
FIG. 5 illustrates, for one embodiment, a flow diagram to form the integrated transformer of FIG. 1.

Transformer 100 may be fabricated in any suitable manner. For one embodiment, transformer 100 is fabricated in accordance with flow diagram 500 as illustrated in FIG. 5. Although described in the context of inductor 110 of FIG. 2, each inductor 110 and 160 may be fabricated in accordance with flow diagram 500 over the same substrate to form transformer 100.

For block 502 of FIG. 5, dielectric layer 202 is formed over substrate 201. Substrate 201 for one embodiment comprises any suitable semiconductor material, such as silicon (Si), silicon germanium (SiGe), germanium (Ge), or gallium arsenide (GaAs) for example. For another embodiment, substrate 201 may comprise a polyimide, a suitable organic material, a printed circuit board, or a suitable dielectric material such as glass, quartz, or ceramic for example. Dielectric layer 202 may comprise any suitable dielectric material, such as an oxide of silicon, silicon nitride, or silicon oxynitride for example, and may be formed to any suitable thickness using any suitable technique. For one embodiment, dielectric layer 202 is formed by depositing silicon dioxide (SiO$_2$) over substrate 201 to a thickness of approximately 2 microns ($\mu$m) using a suitable chemical vapor deposition (CVD) technique. For another embodiment where substrate 201 comprises silicon (Si), dielectric layer 202 may be formed by growing approximately 2 microns ($\mu$m) of silicon dioxide (SiO$_2$) on substrate 201.

Although illustrated in FIG. 2 as forming dielectric layer 202 directly over substrate 201, dielectric layer 202 may be formed over one or more suitable layers, such as one or more interconnect, via, dielectric, and/or device layers for example, formed over substrate 201.

For block 504, magnetic layer 204 is formed over dielectric layer 202. Magnetic layer 204 may comprise any suitable magnetic material and may be formed to any suitable thickness using any suitable technique. Pure elements or alloys comprising, for example, iron (Fe), nickel (Ni), cobalt (Co), manganese (Mn), zinc (Zn), zirconium (Zr), tantalum (Ta), rhenium (Re), silicon (Si), and/or one or more rare earth elements may be used. Some alloys that may be used include, for example, nickel-iron (NiFe), cobalt-zirconium-tantalum (CoZrTa), cobalt-zirconium-niobium (CoZrNb), iron-tantalum-nickel (FeTaNi), nickel-iron-rhenium (NiFeRe), and ferro-silicon. For one embodiment, magnetic layer 204 is formed by sputter depositing an amorphous cobalt (Co) alloy, such as a suitable cobalt-zirconium-tantalum (CoZrTa) alloy for example, to a thickness in the range of approximately 0.1 microns ($\mu$m) to approximately 1.0 micron ($\mu$m) over dielectric layer 202. The magnetic material for one embodiment for magnetic layer 204 may be deposited in the presence of an applied magnetic field to induce desirable magnetic properties in magnetic layer 204.

For block 506, magnetic layer 204 is patterned to help define pedestals and trenches for inductor 110. Magnetic layer 204 may be patterned using any suitable patterning technique. Magnetic layer 204 for one embodiment is patterned by forming a patterned mask over magnetic layer 204, etching magnetic layer 204 to pattern magnetic layer 204 in accordance with the patterned mask, and removing the patterned mask. The patterned mask may comprise any suitable material, such as photoresist for example, formed to any suitable thickness and may be patterned using any suitable technique. Magnetic layer 204 may be etched using any suitable etch technique, such as a suitable wet etching technique for example.

Magnetic layer 204 may also be patterned to define one or more slots to help reduce Eddy currents that can form in magnetic layer 204 and to help increase the resonance frequency $\omega_r$ for inductor 110. Magnetic layer 204 may be patterned to define any suitable number of one or more slots with any suitable dimensions and orientation at any suitable one or more locations relative to conductive layer 208. Magnetic layer 204 for one embodiment is patterned to define slots having a width in the range of approximately 0.05 microns ($\mu$m) to approximately 15 microns ($\mu$m). One or more slots may be perpendicular to or at any other suitable angle relative to the flow of current through conductive layer 208.

Forming magnetic layer 204 and/or patterning magnetic layer 204 is optional.

Dielectric layer 202 is patterned for block 506 to help define pedestals and trenches for inductor 110. Dielectric layer 202 may be patterned using any suitable patterning technique.

Dielectric layer 202 for one embodiment is patterned by etching dielectric layer 202 in accordance with the patterned mask over magnetic layer 204 and removing the patterned mask.

Dielectric layer 202 for another embodiment is patterned by forming a patterned mask over dielectric layer 202, etching dielectric layer 202 to pattern dielectric layer 202 in accordance with the patterned mask, and removing the patterned mask. The patterned mask may comprise any suitable material, such as photoresist for example, formed to any suitable thickness and may be patterned using any suitable technique.

Dielectric layer 202 may be etched using any suitable etch technique, such as a suitable dry etching technique for example.

For another embodiment, dielectric layer 202 may be patterned to help define pedestals and trenches for inductor 110 prior to forming magnetic layer 204. In this manner, magnetic layer 204 may be formed over the bottom and/or sidewalls of each trench.

For block 508, dielectric layer 206 is formed over magnetic layer 204 and along the sidewalls and bottom of the trenches for inductor 110. For one embodiment where magnetic layer 204 defines one or more slots, dielectric layer 206 fills each such slot.

Dielectric layer 206 may comprise any suitable dielectric material, such as an oxide of silicon, silicon nitride, or silicon oxynitride for example, and may be formed to any suitable thickness using any suitable technique. For one embodiment, dielectric layer 206 is formed by depositing silicon dioxide (SiO$_2$) over magnetic layer 204 to a thickness of approximately 5000 angstroms (Å) using a tetraethyl orthosilicate (TEOS) silicon dioxide (SiO$_2$) plasma enhanced chemical vapor deposition (PECVD) system.

For block 510, dielectric layer 206 is patterned. Dielectric layer 206 may be patterned using any suitable patterning technique. Dielectric layer 206 may be patterned, for example, to form one or more vias to magnetic layer 204 and/or to conductive layer 208.

Dielectric layer 206 for one embodiment is patterned by forming a patterned mask over dielectric layer 206, etching dielectric layer 206 to pattern dielectric layer 206 in accordance with the patterned mask, and removing the patterned mask. The patterned mask may comprise any suitable material, such as photoresist for example, formed to any suitable thickness and may be patterned using any suitable technique. Dielectric layer 206 may be etched using any suitable etch technique, such as a suitable dry etch technique for example.

Forming and/or patterning dielectric layer 206 is optional. Dielectric layer 206 may not be formed, for example, where each trench contains dielectric material to help insulate conductive layer 208 from substrate 201 and where magnetic layer 204 is not to be formed.

For block 512, conductive layer 208 is formed over dielectric layer 206. Conductive layer 208 may comprise any suitable conductive material and may be formed to any suitable thickness using any suitable technique. Suitable conductive materials include, for example, copper (Cu), aluminum (Al), tungsten (W), molybdenum (Mo), titanium (Ti), gold (Au), silver (Ag), a metal silicide, a metal nitride, polysilicon, or an alloy containing one or more such conductive materials, such as an aluminum-copper (AlCu) alloy, an aluminum-silicon (AlSi) alloy, an aluminum-copper-silicon (AlCuSi) alloy, and a titanium nitride (TiN) alloy for example. Conductive layer 208 for one embodiment has a thickness in the range of approximately 1 micron ($\mu$m) to approximately 15 microns ($\mu$m). For one embodiment, conductive layer 208 is formed by sputter depositing an aluminum-copper-silicon (AlCuSi) alloy over dielectric layer 206 to a thickness of approximately 1 micron ($\mu$m).

Conductive layer 208 for one embodiment may also be formed to comprise an underlying adhesion and/or diffusion barrier layer and/or an overlying adhesion and/or diffusion barrier layer. Conductive layer 208 may also be formed to comprise any overlying layer to prevent hillocking of the conductive material for conductive layer 208. For one embodiment where conductive layer 208 comprises an aluminum-copper-silicon (AlCuSi) alloy, a titanium (Ti) layer may be deposited prior to depositing the aluminum-copper-silicon (AlCuSi) alloy and another titanium (Ti) layer may be deposited over the deposited aluminum-copper-silicon (AlCuSi) alloy.

For block 514, conductive layer 208 is patterned to form a conductor defining a signal path along one or more legs of pedestals and trenches. Conductive layer 208 may be patterned to define a signal path having any suitable width, thickness, and length and any suitable spacing between legs to form a conductor covering an area of any suitable shape and size.

Conductive layer 208 may be patterned using any suitable patterning technique. Conductive layer 208 for one embodiment is patterned by forming a patterned mask over conductive layer 208, etching conductive layer 208 to pattern conductive layer 208 in accordance with the patterned mask, and removing the patterned mask. The patterned mask may comprise any suitable material, such as a photoresist and a silicon dioxide (SiO$_2$) hard mask for example, formed to any suitable thickness and may be patterned using any suitable technique. Conductive layer 208 may be etched using any suitable etch technique, such as a suitable plasma dry etching technique for example.

Inductor 110 for another embodiment is fabricated using a suitable damascene process to form conductive layer 208. Rather than forming and patterning conductive layer 208, dielectric layer 206 or another dielectric layer formed over dielectric layer 206 may be patterned to define suitable trenches and/or vias such that a conductive material, such as copper (Cu) for example, may be electroplated over the dielectric layer and polished with a suitable chemical-mechanical polishing (CMP) technique, for example, to form conductive layer 208. One or more vias to magnetic layer 204 may then be defined through the dielectric layer. Conductive layer 208 may be formed in this manner to a thickness of approximately 2.2 microns ($\mu$m) where transformer 100 is integrated in an integrated circuit or to a thickness of approximately 15 microns ($\mu$m) where transformer 100 is mounted in an integrated circuit package.

For another embodiment, conductive layer 208 is formed by a layer of conductive material at the bottom of each trench, conductive vias, and a patterned layer of conductive material over each pedestal such that the layer of conductive material at the bottom of each trench is conductively coupled to the layer of conductive material over each pedestal by the conductive vias.

For block 516, dielectric layer 210 is formed over conductive layer 208. Dielectric layer 210 may comprise any suitable dielectric material, such as an oxide of silicon, silicon nitride, or silicon oxynitride for example, and may be formed to any suitable thickness using any suitable technique. For one embodiment, dielectric layer 210 is formed by depositing silicon dioxide (SiO$_2$) over conductive layer 208 to a thickness of approximately 5000 angstroms (Å) using a tetraethyl orthosilicate (TEOS) silicon dioxide (SiO$_2$) plasma enhanced chemical vapor deposition (PECVD) system.

For block 518, dielectric layer 210 is patterned. Dielectric layer 210 may be patterned using any suitable patterning technique. Dielectric layer 210 may be patterned, for example, to form one or more vias to magnetic layer 212 and/or to conductive layer 208.

Dielectric layer 210 for one embodiment is patterned by forming a patterned mask over dielectric layer 210, etching dielectric layer 210 to pattern dielectric layer 210 in accordance with the patterned mask, and removing the patterned mask. The patterned mask may comprise any suitable material, such as photoresist for example, formed to any suitable thickness and may be patterned using any suitable technique. Dielectric layer 210 may be etched using any suitable etch technique, such as a suitable dry etch technique for example.

Forming and/or patterning dielectric layer 210 is optional. Dielectric layer 210 may not be formed, for example, where magnetic layer 212 is not to be formed over conductive layer 208.

For block 520, magnetic layer 212 is formed over dielectric layer 210. Magnetic layer 212 may comprise any suitable magnetic material and may be formed to any suitable thickness using any suitable technique. Pure elements or alloys comprising, for example, iron (Fe), nickel (Ni), cobalt (Co), manganese (Mn), zinc (Zn), zirconium (Zr), tantalum (Ta), rhenium (Re), silicon (Si), and/or one or more rare earth elements may be used. Some alloys that may be used include, for example, nickel-iron (NiFe), cobalt-zirconium-tantalum (CoZrTa), cobalt-zirconium-niobium (CoZrNb), iron-tantalum-nickel (FeTaNi), nickel-iron-rhenium (NiFeRe), and ferro-silicon. For one embodiment, magnetic layer 212 is formed by sputter depositing an amorphous cobalt (Co) alloy, such as a suitable cobalt-zirconium-tantalum (CoZrTa) alloy for example, to a thickness in the range of approximately 0.1 microns ($\mu$m) to approximately 1.0 micron ($\mu$m) over dielectric layer 210. The magnetic material for one embodiment for magnetic layer 212 may be deposited in the presence of an applied magnetic field to induce desirable magnetic properties in magnetic layer 212.

For block 522, magnetic layer 212 is patterned. Magnetic layer 212 may be patterned using any suitable patterning technique.

Magnetic layer 212 for one embodiment is patterned by forming a patterned mask over magnetic layer 212, etching magnetic layer 212 to pattern magnetic layer 212 in accordance with the patterned mask, and removing the patterned mask. The patterned mask may comprise any suitable material, such as photoresist for example, formed to any suitable thickness and may be patterned using any suitable technique. Magnetic layer 212 may be etched using any suitable etch technique, such as a suitable wet etching technique for example.

Magnetic layer 212 may also be patterned to define one or more slots to help reduce Eddy currents that can form in magnetic layer 212 and to help increase the resonance frequency $\omega_r$ for inductor 110. Magnetic layer 212 may be patterned to define any suitable number of one or more slots with any suitable dimensions and orientation at any suitable one or more locations relative to conductive layer 208. Magnetic layer 212 for one embodiment is patterned to define slots having a width in the range of approximately 0.05 microns ($\mu$m) to approximately 15 microns ($\mu$m). One or more slots may be perpendicular to or at any other suitable angle relative to the flow of current through conductive layer 208.

Forming magnetic layer 212 and/or patterning magnetic layer 212 is optional.

Inductor 110 may be fabricated such that a voltage potential may be applied to node 114 and/or node 116 in any suitable manner. Inductor 110 may be fabricated, for example, such that a voltage potential may be applied to node 114 and/or node 116 from beneath conductive layer 208 and/or from above conductive layer 208. Nodes 114 and/or 116 may each be conductively coupled to circuitry from beneath and/or above inductor 110 by forming a respective via to conductive layer 208 and filling the via with a suitable conductive material. Where inductor 110 comprises magnetic layer 204 and/or magnetic layer 212, a portion of magnetic layer 204 and/or magnetic layer 212 may optionally be isolated to serve as a portion of a conductive contact to conductive layer 208.

Magnetic layers 204 and 212 may be optionally coupled to one another by forming a via over magnetic layer 204 at or near one or both ends of each pedestal and filling the via with magnetic material as magnetic layer 212 is formed, for example. Magnetic layer 204 and a corresponding lower magnetic layer of inductor 160 for one embodiment may be formed simultaneously and remain coupled to one another where possible after any patterning. Magnetic layer 212 and a corresponding upper magnetic layer of inductor 160 for one embodiment may be formed simultaneously and remain coupled to one another where possible after any patterning.

Magnetic Layer Processing

Figure 6:
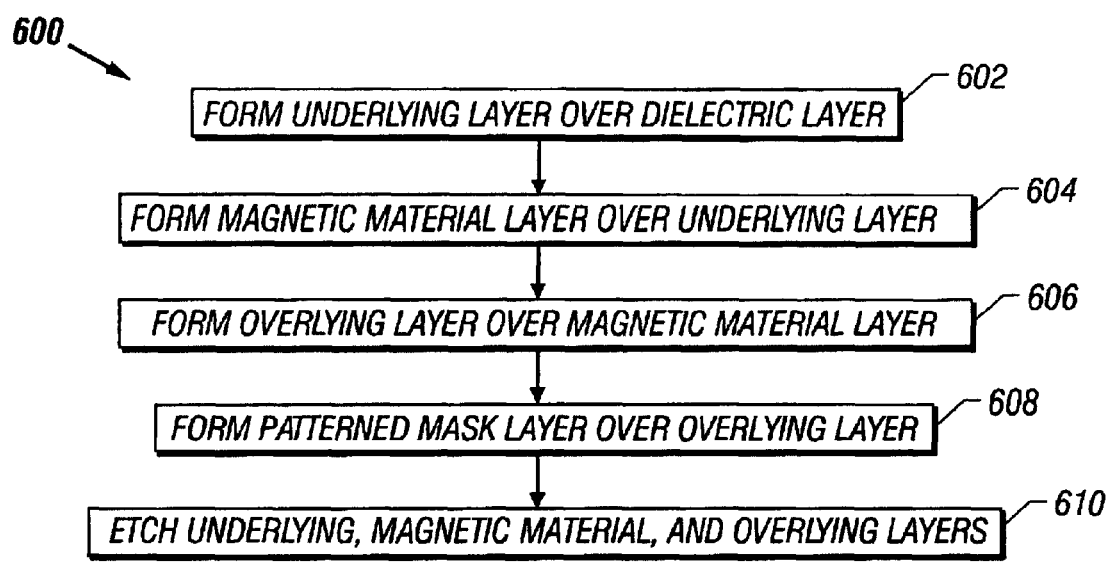
FIG. 6 illustrates, for one embodiment, a flow diagram to form a magnetic layer.

Magnetic layers 204 and 212 may each be formed and patterned in any suitable manner. For one embodiment, each magnetic layer 204 and 212 is formed and patterned in accordance with flow diagram 600 as illustrated in FIG. 6. Flow diagram 600 is described in the context of magnetic layer 204 for the sake of simplicity.

For block 602 of FIG. 6, an underlying layer is formed over dielectric layer 202. The underlying layer may serve as an adhesion layer and/or as a diffusion barrier layer for magnetic layer 204.

The underlying layer may comprise any suitable material and may be formed to any suitable thickness using any suitable technique. For one embodiment where the magnetic material for magnetic layer 204 comprises an amorphous cobalt (Co) alloy, such as cobalt-zirconium-tantalum (CoZrTa) for example, titanium (Ti) may be sputter deposited over dielectric layer 202 to a suitable thickness, such as approximately 250 angstroms (Å) for example, using a physical vapor deposition (PVD) system, for example, to form the underlying layer. Titanium (Ti) helps the cobalt (Co) alloy adhere to dielectric layer 202.

The underlying layer is optional and may not be used, for example, where adhesion and/or diffusion are of minimized concern for the magnetic material of magnetic layer 204.

For block 604 of FIG. 6, a magnetic material layer is formed over the underlying layer. The magnetic material layer may comprise any suitable material and may be formed to any suitable thickness using any suitable technique.

The magnetic material layer for one embodiment comprises cobalt (Co). The magnetic material layer for one embodiment comprises an amorphous cobalt (Co) alloy comprising cobalt (Co) and any suitable one or more elements of any suitable atomic or weight percentage. The amorphous cobalt (Co) alloy may have any suitable atomic order. For one embodiment, the amorphous cobalt (Co) alloy has an atomic order in the range of approximately 1 angstrom (Å) to approximately 100 angstroms (Å). For one embodiment, the amorphous cobalt (Co) alloy has an atomic order in the range of approximately 1 angstrom (Å) to approximately 25 angstroms (Å). For one embodiment, the amorphous cobalt (Co) alloy has an atomic order in the range of approximately 1 angstrom (Å) to approximately 10 angstroms (Å).

The magnetic material layer for one embodiment comprises an amorphous cobalt (Co) alloy comprising cobalt (Co) and zirconium (Zr). Zirconium (Zr) helps make cobalt (Co) amorphous. The magnetic material layer for one embodiment comprises a cobalt-zirconium (CoZr) alloy having one or more additional elements, such as tantalum (Ta) or niobium (Nb) for example, that help make the cobalt-zirconium (CoZr) alloy magnetically softer. The magnetic material layer for one embodiment comprises a cobalt-zirconium (CoZr) alloy having one or more additional elements, such as a rare earth element for example, that help increase the ferromagnetic resonance of the cobalt-zirconium (CoZr) alloy. Rare earth elements include rhenium (Re), neodymium (Nd), praseodymium (Pr), and dysprosium (Dy) for example. Rhenium (Re) helps reduce stress and magnetostriction for the cobalt-zirconium (CoZr) alloy.

Where the magnetic material layer comprises a cobalt-zirconium (CoZr) alloy, the magnetic material layer may comprise, for example, approximately 3 atomic percent to approximately 10 atomic percent zirconium (Zr).

Where the magnetic material layer comprises a cobalt-zirconium-tantalum (CoZrTa) alloy, the magnetic material layer may comprise, for example, approximately 3 atomic percent to approximately 10 atomic percent zirconium (Zr) and may comprise up to and including approximately 10 atomic percent tantalum (Ta). The magnetic material layer for one embodiment comprises approximately 91.5 atomic percent cobalt (Co), approximately 4 atomic percent zirconium (Zr), and approximately 4.5 atomic percent tantalum (Ta). Such a CoZrTa alloy can operate in the GigaHertz range and can withstand temperatures up to approximately 450° Celsius without crystallizing or significantly changing its relevant properties.

Where the magnetic material layer comprises a cobalt-zirconium-rhenium (CoZrRe) alloy, the magnetic material layer may comprise, for example, approximately 3 atomic percent to approximately 10 atomic percent zirconium (Zr) and may comprise up to and including approximately 3 atomic percent rhenium (Re). The magnetic material layer for one embodiment comprises approximately 89 atomic percent cobalt (Co), approximately 8 atomic percent zirconium (Zr), and approximately 3 atomic percent rhenium (Re).

The magnetic material layer may be formed to any suitable thickness. The magnetic material layer for one embodiment has a thickness in the range of approximately 0.05 microns ($\mu$m) to approximately 2.0 microns ($\mu$m). The magnetic material layer for one embodiment has a thickness in the range of approximately 0.2 microns ($\mu$m) to approximately 1.0 micron ($\mu$m). The magnetic material layer for one embodiment has a thickness of approximately 0.4 microns ($\mu$m).

The magnetic material layer for one embodiment is sputter deposited using a physical vapor deposition (PVD) system, for example. The magnetic material layer for one embodiment is deposited in the presence of an applied magnetic field to induce desirable magnetic properties in the magnetic material layer. The magnetic material layer may be deposited, for example, in the presence of a fixed magnetic field, an approximately 180° switching magnetic field, or an orthogonal switching magnetic field.

The magnetic material layer for one embodiment may be deposited in sublayers of any suitable thickness, such as approximately 0.2 microns ($\mu$m) for example, to help prevent overheating and crystal growth during deposition. Each sublayer for one embodiment may be deposited in the presence of a magnetic field in such a manner so as to induce a magnetic anisotrophy in the sublayer in a direction parallel to the plane of the sublayer and orthogonal to that of another sublayer. Each sublayer may, for example, be deposited in the presence of an orthogonal switching magnetic field. Substrate 201 may also be repositioned relative to a fixed magnetic field as each sublayer is deposited so as to induce the orthogonal magnetic fields.

For block 606 of FIG. 6, an overlying layer is formed over the magnetic material layer. The overlying layer may serve as an adhesion layer, a diffusion barrier layer, and/or as an anti-reflective coating for lithography for magnetic layer 204. The overlying layer may comprise any suitable material and may be formed to any suitable thickness using any suitable technique.

For one embodiment where the magnetic material layer comprises cobalt (Co), titanium (Ti) may be sputter deposited over the magnetic material layer to a suitable thickness, such as approximately 250 angstroms (Å) for example, using a physical vapor deposition (PVD) system, for example, to form the overlying layer. Titanium (Ti) helps photoresist adhere to cobalt (Co) in patterning magnetic layer 204, helps protect cobalt (Co) from relatively high temperature processes that could potentially oxidize the top surface of the magnetic material layer and possibly damage the relevant properties of cobalt (Co), and may help reduce any undercutting in etching the magnetic material layer.

For another embodiment where the magnetic material layer comprises cobalt (Co), the magnetic material layer is oxidized to form the overlying layer comprising cobalt oxide ($CoO_x$). Cobalt oxide ($CoO_x$) may be formed to any suitable thickness, such as in the range of approximately 10 angstroms (Å) to approximately 100 angstroms (Å) for example. The magnetic material layer for one embodiment is briefly ashed with a suitable relatively low lamp, low temperature recipe to oxidize cobalt (Co) while minimizing any damage to the relevant properties of cobalt (Co). Oxidizing cobalt (Co) in this manner helps photoresist adhere to cobalt (Co) in patterning magnetic layer 204.

The overlying layer is optional and may not be used, for example, where adhesion is of minimized concern for the magnetic material of magnetic layer 204.

For block 608, a patterned mask layer is formed over magnetic layer 204. The mask layer may comprise any suitable material and may have any suitable thickness. The mask layer may be patterned using any suitable technique. The mask layer for one embodiment comprises photoresist that is spun on and then patterned by exposing the mask layer through a suitable mask and developing the mask layer.

For block 610, the underlying layer, the magnetic material layer, and the overlying layer are etched. Magnetic layer 204 for one embodiment is etched using a suitable wet etching technique. For one embodiment where the overlying layer comprises titanium (Ti) or cobalt oxide ($CoO_x$), a suitable dilute hydrofluoric (HF) acid solution is used to etch the overlying layer exposed by the mask layer. For one embodiment, an approximately 50:1 HF acid solution is used. For one embodiment where the magnetic material layer comprises cobalt (Co), a solution of nitric acid is used to wet etch the magnetic material layer exposed by the mask layer. For one embodiment, an approximately 10% solution of nitric ($HNO_3$) acid is used. For one embodiment where the overlying layer comprises titanium (Ti), the overlying layer helps reduce any undercutting in wet etching the magnetic material layer. For one embodiment where the underlying layer comprises titanium (Ti), a suitable dilute hydrofluoric (HF) acid solution is used to etch the underlying layer exposed by the mask layer. For one embodiment, an approximately 50:1 HF acid solution is used.

As substrate 201 is further processed in accordance with flow diagram 500 of FIG. 5, for example, each subsequent process technique is to account for the presence of magnetic layer 204. As one example where magnetic layer 204 comprises cobalt (Co), exposing magnetic layer 204 to a plasma or atmosphere containing oxygen at relatively high temperatures may damage the relevant properties of magnetic layer 204. The effects of subsequent process techniques on magnetic layer 204 may be monitored using a permeance meter, for example.

For one embodiment where dielectric layer 202 comprises silicon dioxide ($SiO_2$) and photoresist is used to pattern dielectric layer 202, a relatively high power dry etch technique may be used followed by use of a suitable relatively low temperature resist strip technique and a suitable solvent to remove the photoresist. For another embodiment, a relatively low power dry etch technique may be used to help keep the photoresist from hardening.

For one embodiment where magnetic layer 204 comprises cobalt (Co), silicon dioxide ($SiO_2$) is deposited to form dielectric layer 206, for example, using a suitable plasma enhanced chemical vapor deposition (PECVD) system with tetraethyl orthosilicate (TEOS) to help maintain a temperature below approximately 450° Celsius and therefore help minimize any oxidation and crystallization of magnetic layer 204.

For one embodiment where photoresist, for example, is to be removed from magnetic layer 204, dielectric layer 206, and/or from a silicon dioxide ($SiO_2$) hard mask over conductive layer 208, a suitable relatively low temperature resist strip technique and a suitable solvent may be used instead of a typical relatively high temperature ash technique to avoid exposing magnetic layer 204 to plasmas at relatively high temperatures for relatively long periods of time. For another embodiment where photoresist, for example, is used in etching silicon dioxide ($SiO_2$), such as for dielectric layer 206 for example, the silicon dioxide ($SiO_2$) may be etched using a suitable relatively low power and relatively low temperature dry etch technique to help minimize any hardening of the photoresist. The photoresist may then be removed using a suitable solvent.

Following fabrication of transformer 100 with magnetic layer 204 and/or magnetic layer 212, magnetic layer 204 and/or magnetic layer 212 may be annealed by exposing transformer 100 to a suitable temperature in the presence of a magnetic field to help vitalize the magnetic properties of magnetic layer 204 and/or magnetic layer 212.

Integrated Autotransformer Structure

Figure 7:
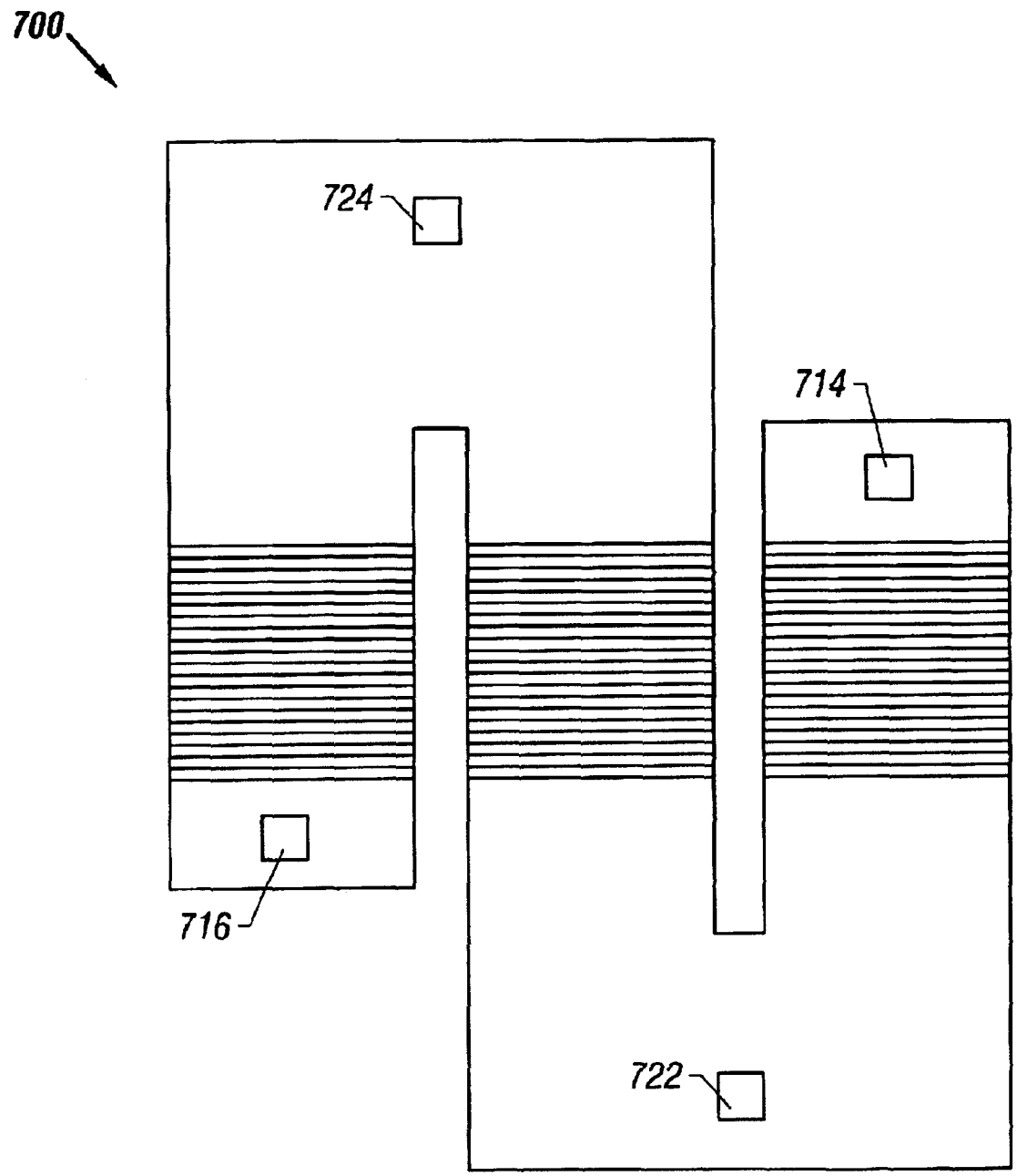
FIG. 7 illustrates, for one embodiment, a plan view of another integrated transformer.

FIG. 7 illustrates, for one embodiment, an integrated transformer 700. Integrated transformer 700 is an autotransformer. As illustrated in FIG. 7, transformer 700 has three legs of one or more trenches. Transformer 700 for one embodiment may be similarly fabricated as inductor 360 of FIG. 3, for example. As a voltage potential is applied across a node 714 near one end of transformer 700 and another node 716 near the other end of transformer 700, a voltage potential between any two points along the conductor of transformer 700 may be tapped. Transformer 700 may be used, for example, for circuits such as in a direct current (dc) voltage converter.

FIG. 7 illustrates, for one embodiment, voltage taps 722 and 724 each at a node between two legs of transformer 700. A voltage potential tapped using voltage taps 722 and/or 724 may be stepped down from the voltage potential applied across transformer 700 as desired in designing transformer 700. The resulting voltage potential, for example, across voltage tap 722 and voltage tap 724, node 714 and voltage tap 722, node 714 and voltage tap 724, node 716 and voltage tap 722, and/or node 716 and voltage tap 724 may be tapped.

For another embodiment, a predetermined voltage potential, such as ground for example, may be applied to voltage tap 722 and/or voltage tap 724. As a voltage potential is applied across transformer 700, the resulting voltage potential across node 714 and voltage tap 722, node 714 and voltage tap 724, node 716 and voltage tap 722, and/or node 716 and voltage tap 724 may be tapped.

Each leg of transformer 700 may define any suitable number of one or more trenches of any suitable shape, dimensions, and spacing between trenches. Each trench for one embodiment may be shaped with a generally rectangular cross-sectional profile across the width of the trench. For other embodiments, one or more trenches of each leg may be shaped with a generally stepped cross-sectional profile or a generally U-shaped or V-shaped cross-sectional profile. The number of trenches, the shape and dimensions of each trench, and the spacing between trenches on each leg of transformer 700 may help determine the amount of the voltage potential tapped using voltage taps 722 and/or 724 for a given voltage potential applied across transformer 700. The material and dimensions of a conductor for transformer 700 may also help determine the amount of the voltage potential tapped using voltage taps 722 and/or 724 for a given voltage potential applied across transformer 700.

Transformer 700 may be fabricated such that a voltage potential may be tapped from the conductor of transformer 700 in any suitable manner. Transformer 700 may be fabricated, for example, such that a voltage potential may be tapped from beneath the conductor of transformer 700 and/or from above the conductor of transformer 700. Voltage taps 722 and 724, for example, may be conductively coupled to circuitry from beneath and/or above transformer 700 by forming a respective via to the conductor and filling the via with a suitable conductive material. Where transformer 700 comprises a lower magnetic layer and/or an upper magnetic layer, a portion of the lower magnetic layer and/or the upper magnetic layer may optionally be isolated to serve as a portion of a conductive contact to the conductor.

Although transformer 700 is illustrated as defining one signal path along three legs, any other suitable transformer having any suitable number of one or more signal paths each along any suitable number of one or more legs of any suitable number of one or more trenches may be similarly fabricated and tapped at any suitable location along the conductor of the transformer. The number of legs of the transformer helps determine the amount of the voltage potential tapped at any node between any two legs of the transformer for a given voltage potential applied across the transformer. Also, the signal path along each leg of the transformer may have the same width or a different width, for example, to help reduce resistance as desired.

Although transformer 700 is illustrated in the context of a single inductor, any suitable primary or secondary inductor of any suitable transformer, such as transformer 100 of FIG. 1, transformer 300 of FIG. 3, or transformer 400 of FIG. 4, for example, may be tapped at any suitable location along the conductor of the transformer.

Integrated Circuit and Integrated Circuit Package

Figure 8:
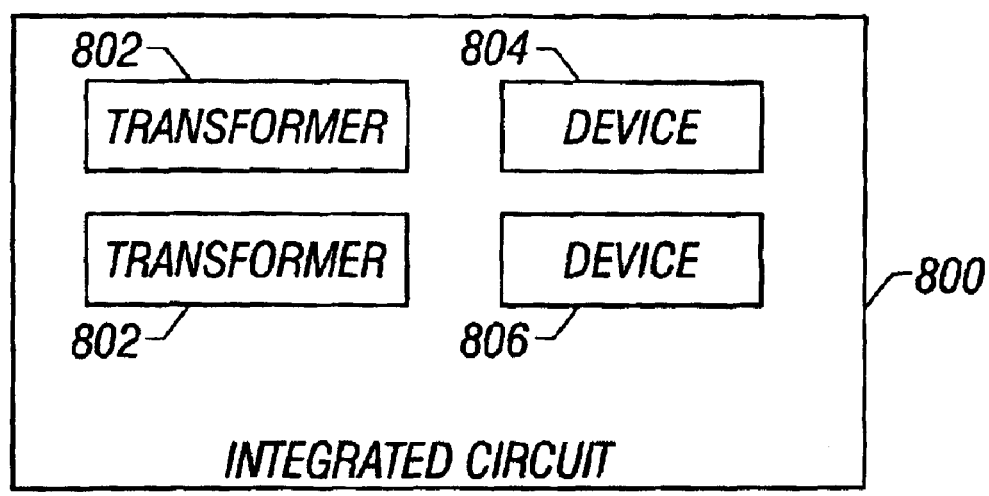
FIG. 8 illustrates, for one embodiment, a block diagram of an integrated circuit comprising one or more transformers.

As illustrated in block diagram form in FIG. 8, one or more integrated transformers 802 may be integrated in an integrated circuit 800 with any suitable one or more integrated circuit devices, such as integrated circuit devices 804 and 806 for example, or with any suitable circuits comprising one or more integrated circuit devices, such as integrated circuit devices 804 and 806 for example. Each transformer 802 may be fabricated, for example, as transformer 100 of FIG. 1, transformer 300 of FIG. 3, transformer 400 of FIG. 4, or transformer 700 of FIG. 7. Although illustrated as comprising two transformers 802, integrated circuit 800 may be fabricated with any suitable number of one or more transformers 802.

Figure 9:
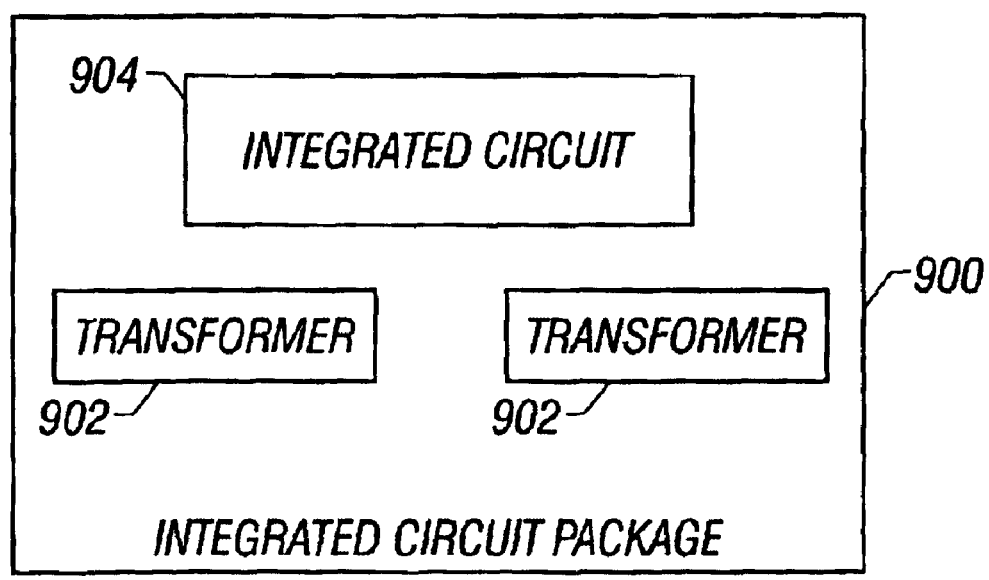
FIG. 9 illustrates, for one embodiment, a block diagram of an integrated circuit package comprising one or more transformers.

As illustrated in block diagram form in FIG. 9, one or more integrated transformers 902 for one embodiment may be mounted in an integrated circuit package 900 for conductive coupling to an integrated circuit 904 housed by integrated circuit package 900. Each transformer 902 may be integrated with or mounted in integrated circuit package 900 and conductively coupled to integrated circuit 904 in any suitable manner. Each transformer 902 may be fabricated, for example, as transformer 100 of FIG. 1, transformer 300 of FIG. 3, transformer 400 of FIG. 4, or transformer 700 of FIG. 7. Although illustrated as comprising two transformers 902, integrated circuit package 900 may be fabricated with any suitable number of one or more transformers. Also, one or more transformers 902 may be fabricated directly on an integrated circuit package.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A transformer comprising:
   a first inductor having an at least one trench, the at least one trench having a pair of walls and a bottom;
   a first conductor defining a first signal path along the pair of walls and the bottom of the at least one trench of the first inductor;
   a first magnetic layer defining a second signal path parallel to the first signal path along the pair of walls and the bottom of the at least one trench of the first inductor;
   a second inductor having an at least one trench, the at least one trench having a pair of walls and a bottom;
   a second conductor defining a third signal oath along the pair of walls and the bottom of the at least one trench of the second inductor;
   a second magnetic layer defining a fourth signal path parallel to the third signal path along the pair of walls and the bottom of the at least one trench of the second inductor.

2. The transformer of claim 1, wherein the first inductor comprises one or more legs each having at least one trench and the second inductor comprises one or more legs each having at least one trench;
   wherein the first conductor defines one or more signal paths each along one or more legs of the first inductor; and
   wherein the second conductor defines one or more signal paths each along one or more legs of the second inductor.

3. The transformer of claim 2, wherein the first inductor has at least two adjacent legs and the second inductor has at least one leg and at least a portion of the at least one leg of the second inductor is positioned between the at least two adjacent legs of the first inductor such that an electromagnetic field generated by the first inductor induces a voltage potential across the second inductor.

4. The transformer of claim 2, wherein the first and second inductors are positioned side-by-side.

5. The transformer of claim 1, wherein the first magnetic layer and the second magnetic layer comprise an amorphous cobalt alloy.

6. The transformer of claim 1, wherein the first inductor comprises one or more legs each having at least one trench and the second inductor comprises one or more legs each having at least one trench; and
   wherein the first magnetic layer and the second magnetic layer are coupled to form magnetic strips extending across one or more legs of the first inductor and one or more legs of the second inductor.

7. A transformer comprising:
   a substrate;
   a first patterned dielectric layer over the substrate, the first patterned dielectric layer defining an at least one trench for a first inductor, the at least one trench for the first inductor having a pair of walls and a bottom and an at least one trench for a second inductor, the at least one trench for the second inductor having a pair of walls and a bottom;
   a first magnetic layer over the first patterned dielectric layer, the first magnetic layer defining a path along the pair of walls and the bottom of the first inductor;
   a second magnetic layer over the first patterned dielectric layer, the second magnetic layer defining a path along the pair of walls and the bottom of the second inductor;
   a first conductor over the first magnetic layer, the first conductor defining a signal path along the pair of walls and the bottom of the first inductor; and
   a second conductor over second magnetic layer, the second conductor defining a signal path along the pair of walls and the bottom of the second inductor.

8. The transformer of claim 7, wherein the first conductor defines one or more signal paths each along one or more legs each having at least one trench and the second conductor defines one or more signal paths each along one or more legs each having at least one trench.

9. The transformer of claim 8, wherein at least a portion of a leg for the second conductor is positioned between two legs for the first conductor.

10. The transformer of claim 8, wherein the first and second conductors are positioned side-by-side.

11. The transformer of claim 7, wherein the first magnetic layer and the second magnetic layer comprise an amorphous cobalt alloy.

12. The transformer of claim 7, comprising a second dielectric layer over the first and second conductors and the first and second magnetic layers over the first dielectric layer, wherein the first magnetic layer lies over the first conductor and the second magnetic layer lies over the second conductor.

13. The transformer of claim 7, further comprising a third magnetic layer over the first conductor and a fourth magnetic layer over the second conductor, and a third dielectric layer over the third magnetic layer and the fourth magnetic layer.

14. The transformer of claim 13, wherein the first conductor defines one or more signal paths each along one or more legs each having one or more trenches and the second conductor defines one or more signal paths each along one or more legs each having one or more trenches; and
   wherein the first, second, third, and fourth magnetic layers are coupled to form magnetic strips extending across one or more legs for the first conductor and one or more legs for the second conductor.

* * * * *

UNITED STATES PATENT AND TRADEMARK OFFICE
CERTIFICATE OF CORRECTION

PATENT NO. : 6,891,461 B2
DATED : May 10, 2005
INVENTOR(S) : Gardner

It is certified that error appears in the above-identified patent and that said Letters Patent is hereby corrected as shown below:

Column 17,
Line 33, delete "oath" and insert -- path --.

Signed and Sealed this

Twelfth Day of July, 2005

JON W. DUDAS
*Director of the United States Patent and Trademark Office*